(12) United States Patent
Kwon et al.

(10) Patent No.: US 7,255,115 B2
(45) Date of Patent: Aug. 14, 2007

(54) APPARATUS FOR CLEANING SEMICONDUCTOR WAFERS

(75) Inventors: Young-Min Kwon, Suwon-si (KR); Chang-Hyeon Nam, Osan-si (KR); Sang-Oh Park, Seongnam-si (KR); Young-Kwang Myoung, Osan-si (KR); Duk-Min Ahn, Haman-gun (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 335 days.

(21) Appl. No.: 10/410,278

(22) Filed: Apr. 10, 2003

(65) Prior Publication Data
US 2004/0000330 A1 Jan. 1, 2004

(30) Foreign Application Priority Data
Jun. 27, 2002 (KR) ............. 10-2002-0036489

(51) Int. Cl.
*B08B 3/00* (2006.01)
(52) U.S. Cl. ............. 134/102.2; 134/95.2; 134/95.3; 134/184; 134/186; 134/200; 134/902
(58) Field of Classification Search ............. 134/102.2, 134/95.2, 95.3, 184, 186, 200, 902
See application file for complete search history.

(56) References Cited
U.S. PATENT DOCUMENTS

| | | | | |
|---|---|---|---|---|
| 5,014,727 A * | 5/1991 | Aigo | ............. | 134/102.2 |
| 5,569,330 A | 10/1996 | Schild et al. | | |
| 5,715,612 A * | 2/1998 | Schwenkler | ............. | 34/470 |
| 5,807,439 A * | 9/1998 | Akatsu et al. | ............. | 134/32 |
| 5,813,133 A * | 9/1998 | Munter et al. | ............. | 34/248 |
| 5,932,027 A * | 8/1999 | Mohindra et al. | ............. | 134/21 |
| 6,045,621 A * | 4/2000 | Puri et al. | ............. | 134/2 |
| 6,354,313 B1 | 3/2002 | Florez | | |
| 6,401,361 B1 * | 6/2002 | Chen et al. | ............. | 34/467 |
| 6,481,447 B1 * | 11/2002 | Smith et al. | ............. | 134/103.2 |
| 2002/0032973 A1 * | 3/2002 | Jung | ............. | 34/467 |
| 2002/0132480 A1 * | 9/2002 | Shindo et al. | ............. | 438/689 |
| 2002/0195125 A1 * | 12/2002 | Jung et al. | ............. | 134/21 |

FOREIGN PATENT DOCUMENTS

| | | |
|---|---|---|
| KR | 2000-0073750 | 12/2000 |
| KR | 2001-0112344 | 12/2001 |

* cited by examiner

*Primary Examiner*—Michael Barr
*Assistant Examiner*—Sarah E. Husband
(74) *Attorney, Agent, or Firm*—Volentine & Whitt, PLLC

(57) ABSTRACT

An apparatus for cleaning semiconductor wafers includes a chamber, a bubbler having a vapor generating part for generating alcohol vapor and a spray pipe for spraying the alcohol vapor into the chamber, a gas supply nozzle for spraying gas into the chamber to dry the wafers, a liquid supply nozzle for supplying cleaning liquid into the chamber and a discharge system. The spray pipe of the bubbler has a liquid retention portion that keeps condensate of the alcohol vapor from issuing into the chamber. The gas supply nozzle has a spray outlet configured to spray the same amount of the drying gas onto all of the wafers in the chamber. The liquid supply nozzle has liquid supply openings only in a side portion thereof so that liquid alcohol will not become trapped therein.

17 Claims, 11 Drawing Sheets

APPARATUS FOR CLEANING SEMICONDUCTOR WAFERS

BACKGROUND OF THE INVENTION

1. Field of the Invention

The present invention relates to an apparatus for manufacturing semiconductor devices. More particularly, the present invention relates to an apparatus for cleaning semiconductor wafers in accordance with the Marangoni principle.

2. Description of the Related Art

When a semiconductor wafer is manufactured into integrated circuit (IC) devices, the wafer is subjected to a series of semiconductor device manufacturing processes such as photolithography, chemical or physical vapor deposition and plasma etching processes. Foreign materials, such as residual chemicals, small particles, and other contaminants, may remain on the surface of the wafer after these processes are carried out. The foreign materials must be removed from the surface of the wafer to assure the quality of the IC devices.

A wafer cleaning process may include both rinsing and drying the wafer to remove foreign materials. A silicon wafer is generally rinsed using de-ionized water. However, the de-ionized water is an aggressive solvent against silicon and will thus eventually dissolve the silicon wafer. Accordingly, the wafer must be completely dried after being rinsed with the de-ionized water.

There are a number of semiconductor wafer cleaning systems commercially available. Recently, wafer cleaning systems based on the Marangoni principle have been widely used in the art. The Marangoni principle is based on the fact that when there is a liquid region wherein two different surface tensions exist, liquid flows from the region of the lower surface tension to the region of the higher surface tension. In Marangoni principle-based wafer cleaning systems, de-ionized water is typically used to rinse the wafer, and isopropyl alcohol (IPA) is typically used to dry the deionized water. The IPA has a lower surface tension than does the de-ionized water. Examples of conventional wafer cleaning systems using the Marangoni principle are disclosed in U.S. Pat. Nos. 5,569,330, 5,807,439, 6,027,574, and 6,354,313. These systems each include a chamber to accommodate wafers, and a bubbler for generating IPA vapor.

SUMMARY OF THE INVENTION

An object of the present invention is to provide a wafer cleaning apparatus that uses the Marangoni principle, and which apparatus exhibits better wafer cleaning characteristics than do previous apparatus.

A specific object of the present invention is to provide a wafer cleaning apparatus that uses the Marangoni principle, and which apparatus prevents condensed alcohol from issuing into the chamber of the apparatus from an exit end of a spray pipe of a bubbler that sprays alcohol vapor into the cleaning and drying chamber.

Yet another object of the present invention is to provide a wafer cleaning apparatus that uses the Marangoni principle, and which apparatus prevents alcohol existing in the form of a mist within the bubbler from being introduced into the cleaning and drying chamber.

Still another aspect of the present invention is to provide a wafer cleaning apparatus that uses the Marangoni principle, and by which the amount of alcohol vapor introduced into the cleaning and drying chamber and the velocity at which the alcohol vapor is introduced into the chamber can be established independently of one another.

Another specific object of the present invention is to provide a wafer cleaning apparatus that uses the Marangoni principle, and which apparatus sprays drying gas uniformly onto a plurality of wafers in the chamber of the apparatus.

Another aspect of the present invention is to provide a wafer cleaning apparatus that uses the Marangoni principle, and which apparatus prevents the wafers from being contaminated when the level of cleaning liquid falls below the level of the liquid supply nozzle(s), such as when the cleaning liquid is discharged.

The apparatus for cleaning a semiconductor wafer of the present invention, comprises. a chamber in which a wafer cleaning process is performed, and a bubbler for producing alcohol (e.g., isopropyl alcohol) vapor. The chamber includes a bath that contains a wafer holder, and a lid that covers the bath. The height of the chamber is at least twice the diameter of the wafers to be cleaned therein. A first supply pipe is disposed at one side of the bath to supply liquid alcohol to the chamber. The liquid alcohol forms a layer on the de-ionized water in chamber. The bubbler includes a vapor generating part for generating the alcohol vapor, and a spray pipe for spraying the alcohol vapor and carrier gas for the alcohol vapor into the chamber.

According to an aspect of the present invention, the spray pipe has a liquid retention portion. This portion of the spray pipe retains liquid, namely the condensate of the alcohol vapor formed at an exit end of the spray pipe, within the spray pipe.

According to another aspect of the present invention, the vapor generating part comprises a housing, a second supply pipe for supplying liquid alcohol to the housing such that the housing becomes partially filled with the liquid alcohol, a third supply pipe submerged in the liquid alcohol inside the housing for supplying the carrier gas into the housing at a level below the surface of the liquid alcohol, and a fourth supply pipe for supplying the carrier gas to the housing at a level above the surface of the liquid alcohol in the housing.

The bubbler may further include a baffle in the form of a connector having a bend that is disposed between the spray pipe and the vapor generating part, and/or porous filter disposed in the vapor generating part. The bend of the connector and the filter serve to prevent the alcohol in the form of a mist from being carried to the spray pipe.

According to yet another aspect of the present invention, the cleaning apparatus comprises at least one gas supply nozzle for spraying drying gas uniformly over a number wafers disposed in the chamber. The gas supply nozzle includes an inlet end adjacent a side of the cleaning and drying chamber, a nozzle body extending from the inlet end, and a spray outlet spanning at least the length over which the number of wafers can be arranged in the chamber. The spray outlet may take the form of a plurality of circular openings having different sizes or spaced from one another by different intervals. Alternatively, the spray outlet of the gas supply nozzle may have the form of a slit extending longitudinally in the nozzle body. The slit is preferably flared outwardly at both ends and/or both sides thereof such that the outer opening of the slit is larger than the inner opening thereof. In addition, the width of the slit may increase along the length of the nozzle body in a direction from the side of the chamber where the inlet end of the nozzle is located.

The cleaning apparatus further includes at least one liquid supply nozzle disposed below a wafer holder for supplying liquid for cleaning the wafer into the chamber. The nozzle body of the liquid supply nozzle has a top portion that faces upwardly towards the wafer holder, and a side portion that faces laterally in a direction perpendicular to the top portion. According to still yet another aspect of the present invention, liquid supply openings of the supply nozzle are provided only in the side portion of the nozzle body. Thus, any liquid IPA on the surface of the cleaning liquid will not be trapped in the liquid supply nozzle during the discharging of the cleaning liquid from the chamber.

The discharge system includes a first discharge pipe for draining the liquid using gravity after the wafers are brought above the surface of the cleaning liquid, and a second discharge pipe for draining the liquid while a portion of the wafers are submerged in the liquid. A pump is connected to the second discharge pipe to control the velocity at which the liquid is drained. Preferably, the alcohol vapor and carrier gas in the chamber are exhausted through the second discharge pipe.

BRIEF DESCRIPTION OF THE DRAWINGS

The above and other objects, features, and advantages of the present invention will be more readily apparent from the following detailed description of preferred embodiments thereof when taken together with the accompanying drawings in which:

FIG. 10a is a cross-sectional view of the gas supply nozzle taken along line C-C of FIG. 9a.

DETAILED DESCRIPTION OF THE PREFERRED EMBODIMENTS

The present invention will now be described more fully hereinafter with reference to the attached figures, in which preferred embodiments of the invention are shown.

Figure 1:
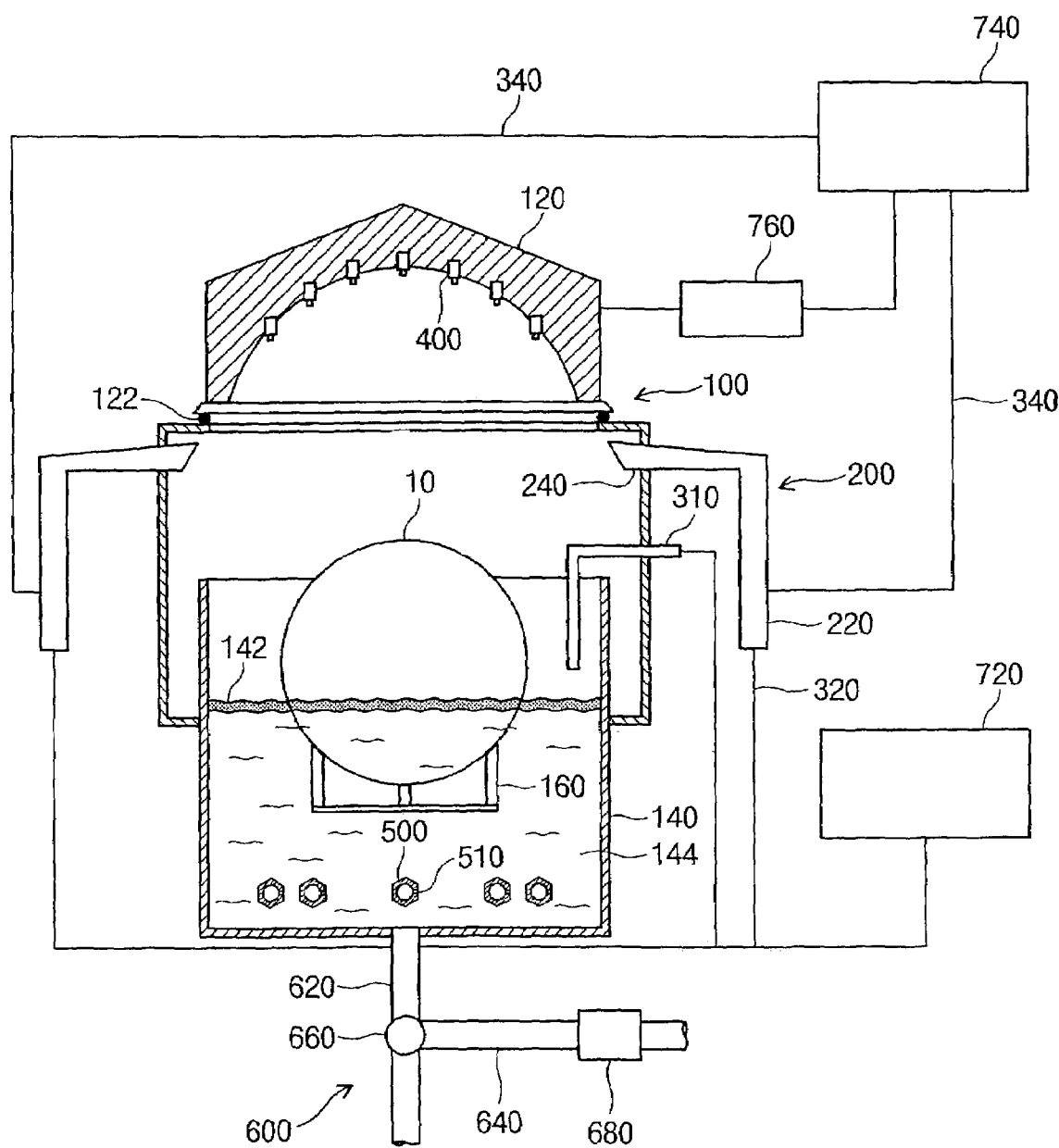
FIG. 1 is a front cross-sectional view of a cleaning apparatus according to the present invention.
Figure 2:
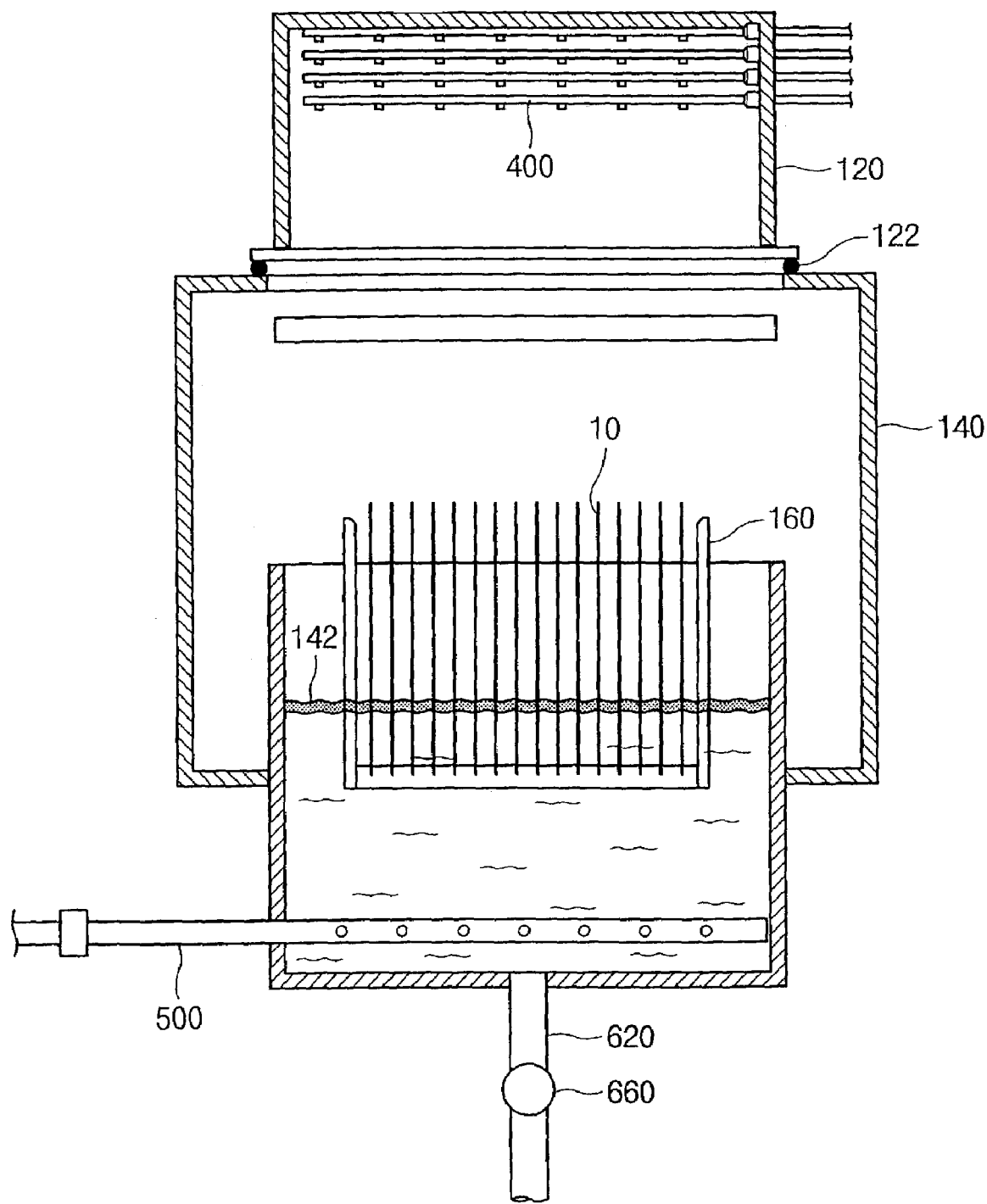
FIG. 2 is a side cross-sectional view of the cleaning apparatus according to the present invention.

Referring to FIG. 1 and FIG. 2, the cleaning apparatus includes a chamber 100 in which a cleaning process is performed, a bubbler 200 for producing an alcohol vapor and for supplying the alcohol vapor to the chamber 100, gas supply nozzles 400 for spraying drying gas in the chamber 100, at least one liquid supply nozzle 500 for supplying liquid into the chamber 100, a discharge section 600 for discharging the liquid, a gas source 740 for storing the gas supplied to the bubbler 200 and the gas supply nozzles 400, and an alcohol source 720 for storing the alcohol liquid supplied to the chamber 100 and the bubbler 200.

The alcohol is isopropyl alcohol (hereinafter referred to as IPA), the drying gas is nitrogen, and the liquid is de-ionized water.

The chamber 100 comprises a bath 140 that contains the wafers 10, and a lid 120 for opening and closing over an open top portion of the bath 140. A wafer holder 160 for supporting the wafers 10 is disposed in the bath 140. The wafer holder 160 can be re-positioned in a vertical direction while the de-ionized water is being discharged. A first supply pipe 310 extends into the bath 140 from the side thereof. Liquid IPA is supplied from the alcohol source 720 to the chamber 100 through the first supply pipe 310 to form an IPA liquid layer 142 on the surface of the de-ionized water in the bath 140.

The lid 120 is semi-cylindrical such that the interior thereof defines a concavity. Accordingly, the wafers 10 can be moved upwardly into the hollow of the lid 120. At this time, the wafer holder 160 may move upwardly without the de-ionized water being discharged from the bath 140. The height of the chamber 100 is thus at least twice the diameter of the wafers 10 to provide enough space for accommodating the wafers 10 entirely above the surface of the de-ionized water.

Figure 3:
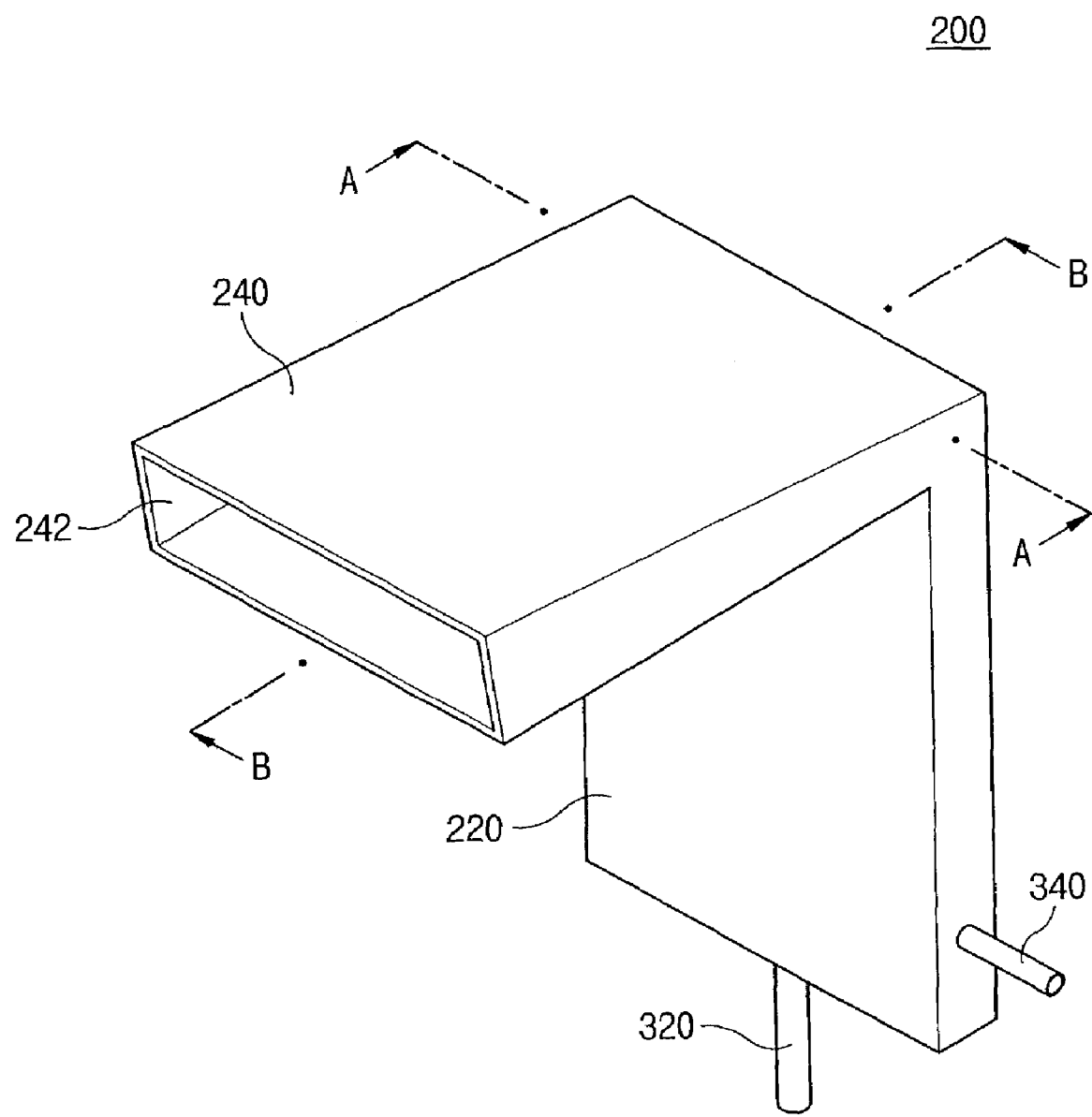
FIG. 3 is a perspective view of a bubbler of the cleaning apparatus shown in FIGS. 1 and 2.
Figure 4A:
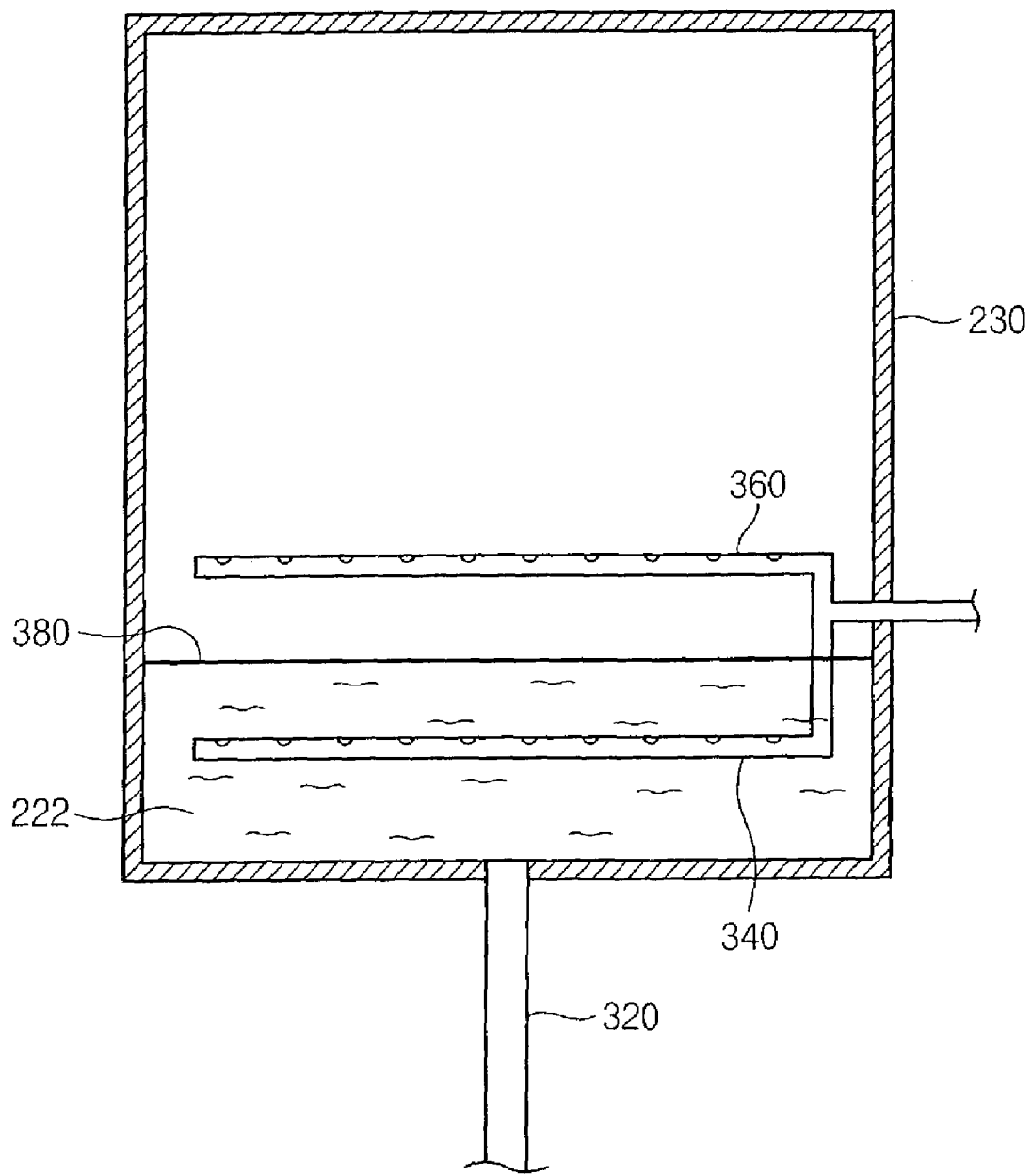
FIG. 4a is a cross-sectional view taken along line A-A of FIG. 3.

Referring to FIG. 3 and FIG. 4A, the bubbler 200 includes a vapor generation part 220 for generating the IPA vapor and a spray pipe 240 for spraying the IPA vapor into the chamber 100. The housing 230 of vapor generation part 220 has the shape of a rectangular parallelepiped, and a part of the housing 230 is filled with liquid IPA 222. A second supply pipe 320 is connected to the bottom of the housing 230. A third supply pipe 340 is connected to a side of the housing 230 and is immersed in the liquid IPA 222. A plurality of holes are formed in an upper portion of the third supply pipe 340. Carrier gas, such as nitrogen, is supplied to the housing 230 through the holes formed in the third supply pipe 340. The carrier gas supplied through the third supply pipe 340 helps the IPA liquid to evaporate and carries the IPA vapor into the chamber 100. The amount of the IPA vapor and the velocity of the IPA vapor are proportional to the amount of the carrier gas that is supplied through the third supply pipe 340.

The vapor generation part 220 includes a fourth supply pipe 360 that is branched from the third supply pipe 340. The fourth supply pipe 360 is located over the surface of the liquid IPA 222. A plurality of holes are formed in the fourth supply pipe 360. The carrier gas that flows through the fourth supply pipe 360 only serves to carry the IPA vapor to the chamber 100, unlike the carrier gas that is supplied through the third supply pipe 340. Accordingly, the amount of the IPA vapor that is produced and the velocity at which the IPA vapor flows into the chamber 400 are independent, i.e., can be established irrespectively of one another, as opposed to the vapor generation parts of conventional wafer cleaning apparatus.

Figure 4B:
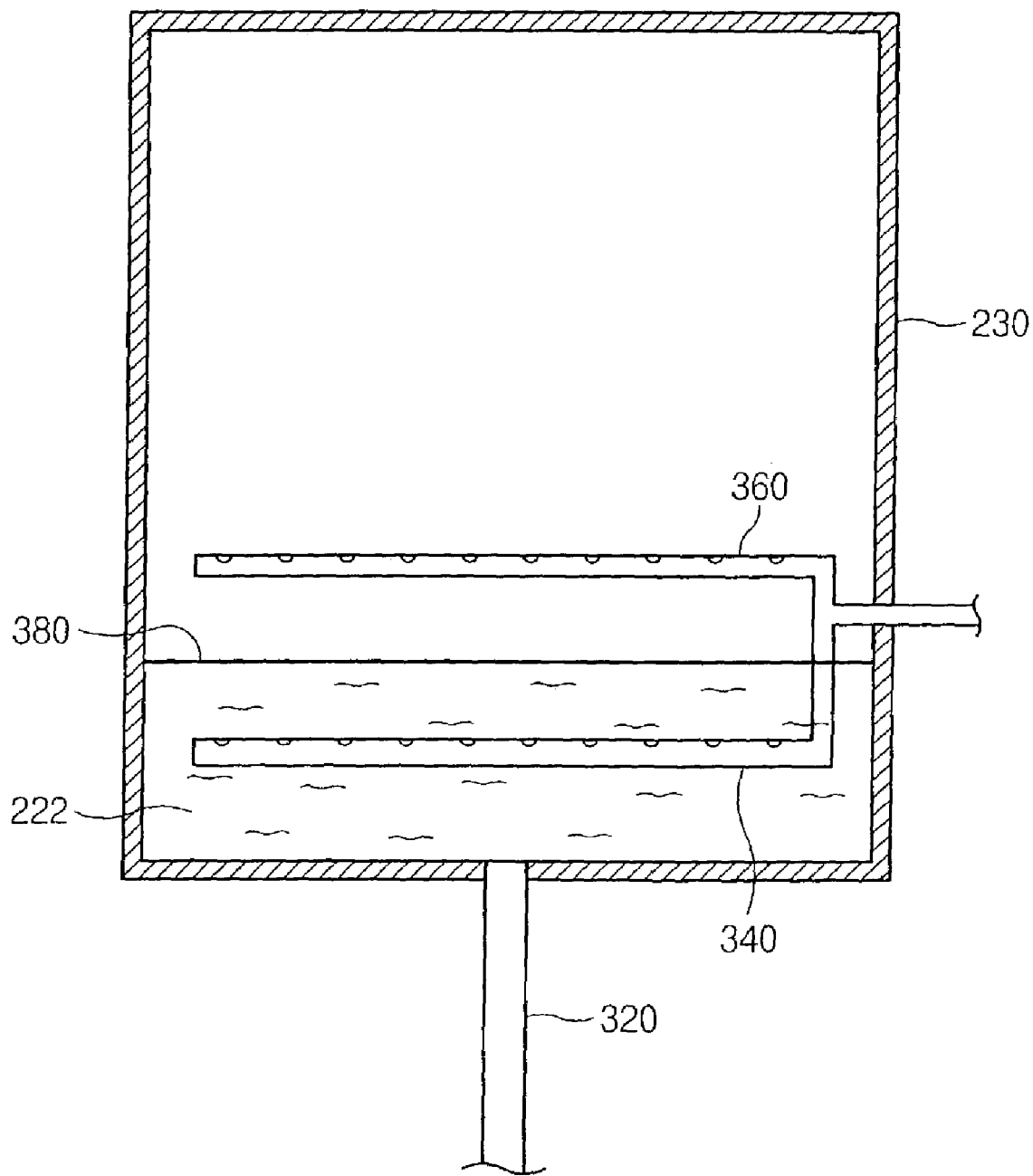
FIG. 4b is a similar cross-sectional view but showing another form of the alcohol vapor generating part of the bubbler.
Figure 4C:
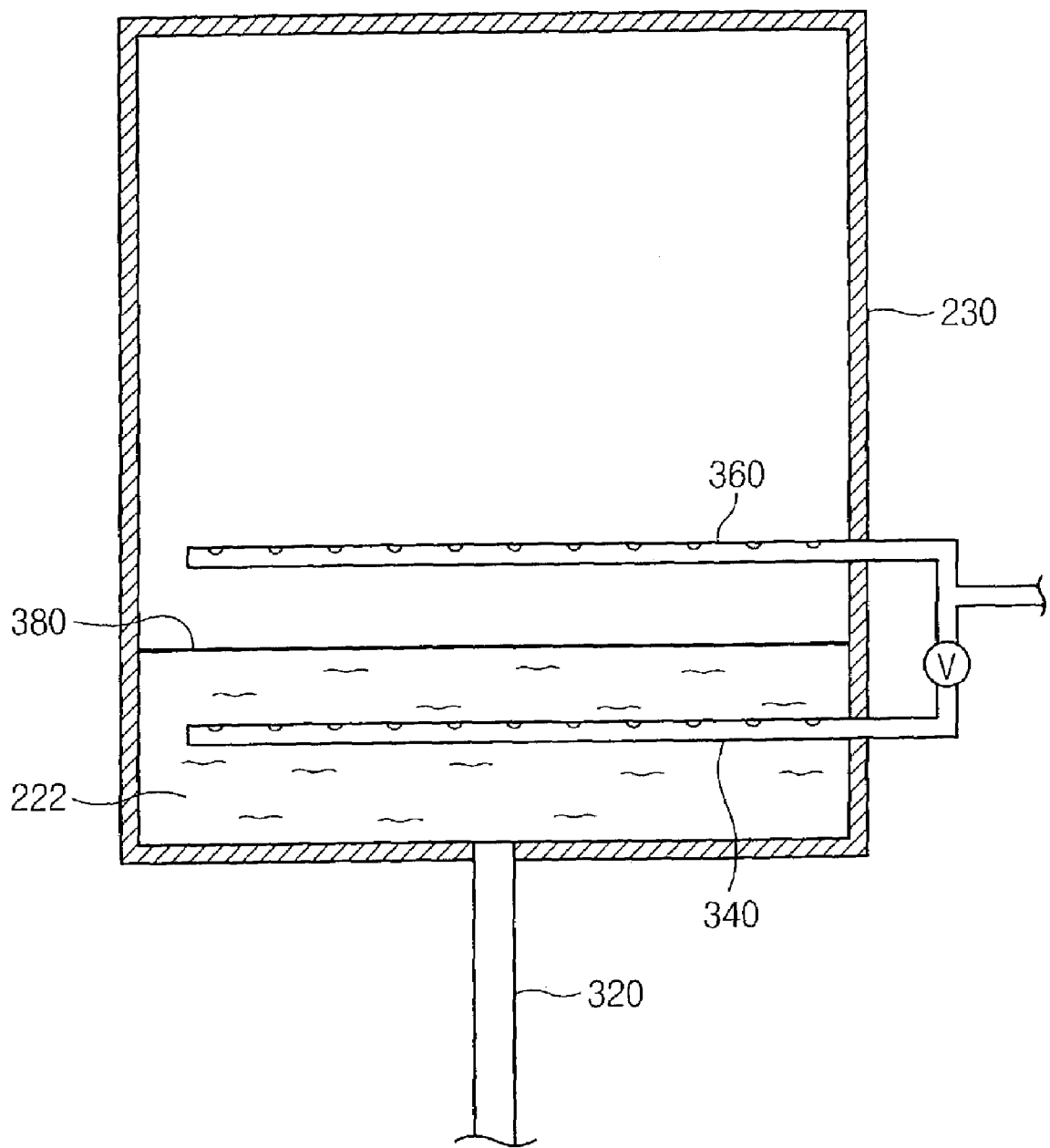
FIG. 4c is a similar cross-sectional view but showing yet another form of the alcoho vapor generating part of the bubbler.

For example, the diameter of the third supply pipe 340 may be different from that of the fourth supply pipe 360. The third supply pipe 340 may be provided with a relatively large diameter to produce a large amount of IPA vapor to be moved to the chamber 100, as shown in FIG. 4B. The fourth supply pipe 360 may be provided with a diameter such that the IPA vapor is supplied rapidly to the chamber 100. Alternatively, the third supply pipe 340 may have the same diameter as the fourth supply pipe 360. In this case, as shown in FIG. 4C, a flow control valve V is connected to the third or fourth supply pipe 340, 360 to control the amount of IPA vapor generated or the velocity of the vapor IPA.

The liquid IPA in the vapor generation part 220 is consumed due to vaporization of the liquid IPA. Therefore, the liquid IPA is continuously supplied to the housing 230 through the second supply pipe 320 to replenish the liquid IPA.

Referring again to FIG. 1, the spray pipe 240 is inserted through the side of the chamber 100 and the IPA vapor and the carrier gas from the bubbler 200 are supplied into the chamber 100 through the spray pipe 240. While the IPA vapor and the carrier gas are sprayed to the chamber 100, condensed liquid of the IPA vapor is formed on the upper portion of the exit end of the spray pipe 240. If the condensed liquid were to fall into the chamber 100, the liquid IPA layer 142 formed on the surface of the de-ionized water in the bath 140 would be destroyed. In this case, the drying process using Marangoni principle could not be performed properly until the liquid IPA layer 142 was restored. The spray pipe 240 has a liquid retention portion to prevent this problem from occurring.

Figure 5:
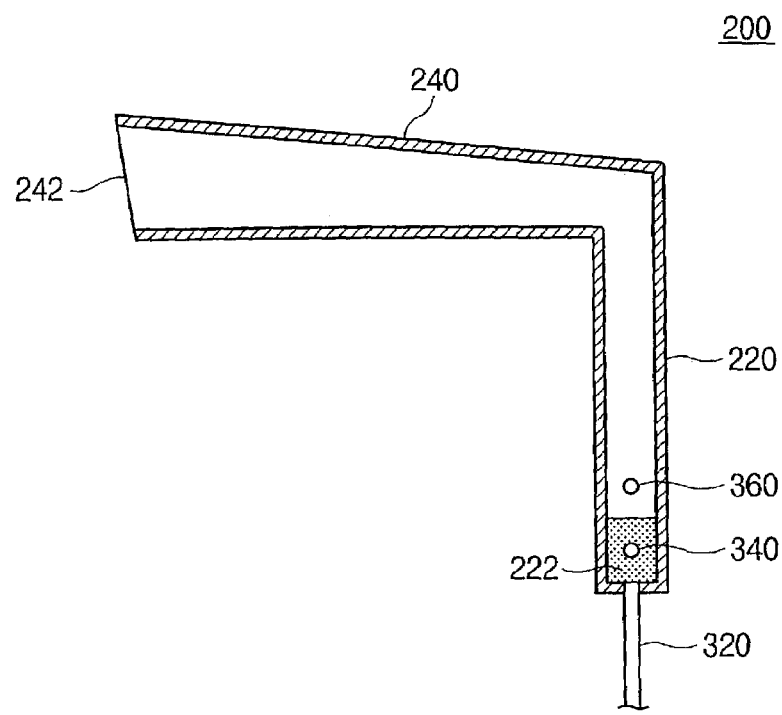
FIG. 5 is a cross-sectional view taken along line B-B of FIG. 3, illustrating a spray pipe.

According to one example shown in FIG. 5, the spray pipe 240 has a quadrilateral cross section. More specifically, the spray pipe 240 has an inclined upper wall as the liquid retention portion. The upper wall of the spray pipe 240 is gently inclined downwardly from the exit end of the pipe 240 at which the IPA vapor condenses. Accordingly, the spray pipe 240 is tapered so that condensed liquid flows from the exit end back into the spray pipe 240.

Figure 6:
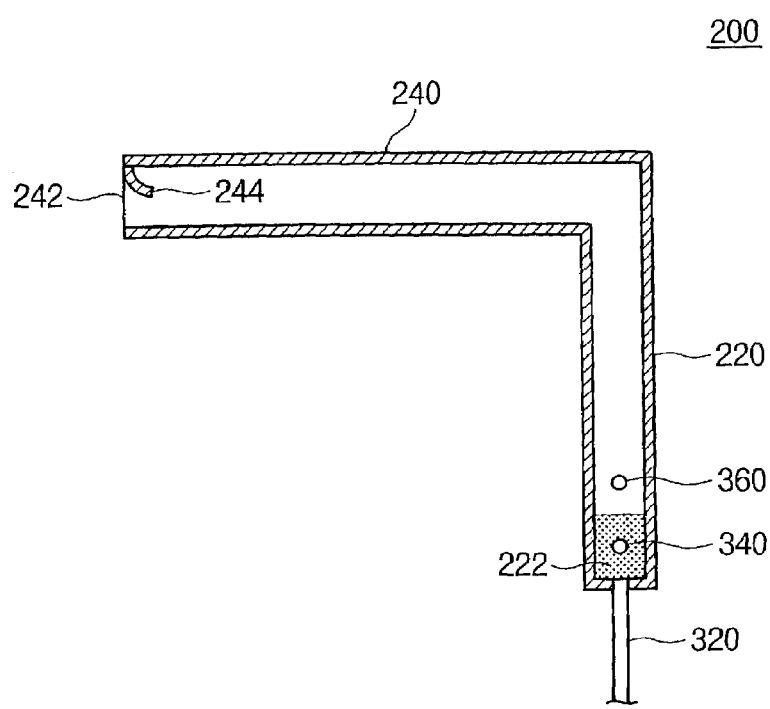
FIG. 6 is a cross-sectional view of a bubbler showing another example of a spray pipe.

Another example of the liquid retention portion is shown in FIG. 6. In this example, the liquid retention portion is a projection 244 in the form of a hook extending from the upper wall at the exit end of the spray pipe 240 back into the spray pipe 240. The condensed liquid thus flows back into the spray pipe 240 along the projection 244 without falling into the chamber 100.

If desired, the spray pipe may comprise both the inclined upper wall shown in FIG. 5 and the projection 244 shown in FIG. 6 as the liquid retention portion.

In addition, part of the IPA exists in the form of a mist. A porous filter 380 is installed on or over the surface of the IPA liquid in the bubbler 200 so as to prevent the IPA mist from being carried into the chamber 100. The porous filter 380 can be heated by a heater (not shown).

Figure 7:
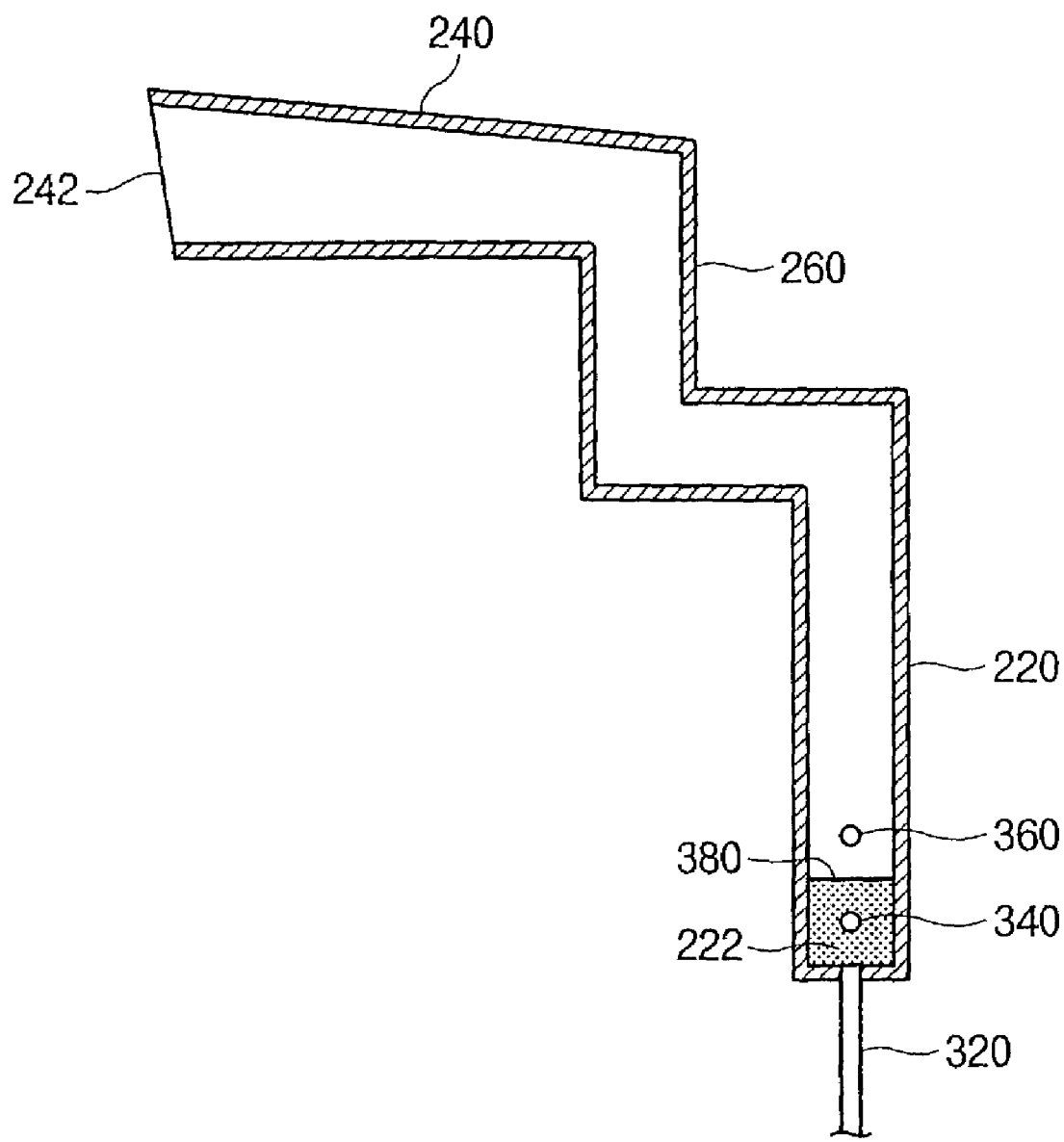
FIG. 7 is a cross-sectional view of another example of the bubbler.

Referring next to FIG. 7, the bubbler 200 may include a connector 260 between the housing 230 and the spray pipe 240. The connector 260 is in the form of a baffle, i.e., has a bend, so as to prevent the IPA mist from being carried to the chamber 100. Drops of any of the IPA mist will accumulate on the wall of the connector 260 and then fall back into the housing 230 of the vapor generation part 220 without ever having moved into the spray pipe 240.

A plurality of liquid supply nozzles 500 extend into the bath 140 to supply liquid used in the cleaning process, such as a process for treating the wafers 10 with a chemical solution or a process for rinsing them. The chemical solution may be electrolysis-ionized or hydrofluoric acid that is of a strength sufficient to remove contaminants such as particles, metal, e.g., copper, and natural oxidation layers from the wafers. When the cleaning process is a rinsing process, the liquid may be de-ionized water.

A plurality of holes 510 are formed in each liquid supply nozzle 500. If the holes 510 were formed in the top of the liquid supply nozzles 500, the de-ionized water could flow easily into the liquid supply nozzles 500, giving rise to this potential problem. Any liquid IPA contained in the deionized water inside of a liquid supply nozzle 500 would evaporate after the surface of the de-ionized water became disposed below the liquid supply nozzle 500 when the de-ionized water is discharged from the bath 140. The evaporated IPA contains little, if any, de-ionized water, and thereby would surely contaminate the wafers 10. However, in the present invention, the holes 510 are formed in a side of each liquid supply nozzle 500. This prevents the de-ionized water containing liquid IPA in the bath 140 from flowing into the liquid supply nozzles 500.

The de-ionized water containing the liquid IPA is discharged through the discharge section 600. The discharge section 600 is connected to the bottom of the bath 140. The discharge section 600 includes a first discharge pipe 620 and a second discharge pipe 640. The first discharge pipe 620 is connected perpendicularly with the bottom of the bath 140 and the second discharge pipe 640 extends from the first discharge pipe 620 horizontally alongside the bottom of the chamber 100. A directional flow control valve 660 is connected to the pipes 620, 640 at the location where the second discharge pipe 640 branches from the first discharge pipe 620 to select the pipe through which the de-ionized water is discharged.

The de-ionized water is discharged through the second discharge pipe 640 while at least a portion of the wafers 10 is immersed in the de-ionized water. A pump is connected to the second discharge pipe 640 for controlling the rate of discharge. The de-ionized water is discharged through the first discharge pipe 620 by gravity once the wafers 10 are entirely located above to the surface of the de-ionized water. Unlike conventional wafer cleaning apparatuses, the cleaning apparatus of the present invention does not have an exhaust hole for exhausting the nitrogen gas or the IPA vapor. Rather, in the present invention, the nitrogen gas and the IPA vapor are exhausted through the second discharge pipe 640. This prevents outside air from invading the chamber 100 through a dedicated exhaust hole.

After all of the de-ionized water is drained, the water and the liquid IPA that are adhered to the wafer 10 should be removed. Drying gas, such as heated nitrogen, is used for this purpose. The drying gas is supplied to the chamber 100 through a plurality of gas supply nozzles 400 installed on an upper surface of the lid 120. A heater 760 is installed in the gas supply line extending between the gas source 760 (gas supply tank) and the gas supply nozzles 400 to heat the drying gas. It is very important that the drying gas is supplied uniformly to all the wafers 10.

Figure 8A:
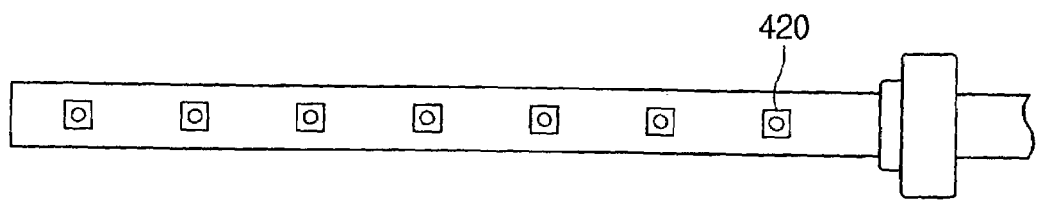
FIG. 8a is a bottom view of a gas supply nozzle of the cleaning apparatus shown in FIG. 2.

Referring to FIG. 8a, each gas supply nozzle 400 has a plurality of circular spray openings spaced therealong from one end thereof to the other. For instance, when a set of N wafers 10 is put in the wafer holder 160, the openings are located over a top portion of and span the first wafer 10 to N-th wafer 10.

Figure 8B:
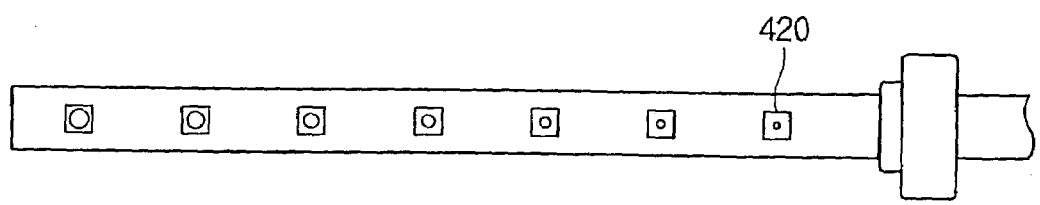
FIG. 8b and FIG. 8c are bottom views of modified examples of the gas supply nozzle

Referring to FIG. 8b, which shows a modified example of the gas supply nozzle 400, the spray openings 420 in the gas supply nozzle 400 have different sizes to ensure that the amount of nitrogen supplied to the N-th wafer 10 is the same as the amount of nitrogen supplied to the first wafer 10. In particular, the size of openings 420 increases as the distance from the side of the chamber 100 from which the gas supply nozzle 400 extends increases.

Figure 8C:
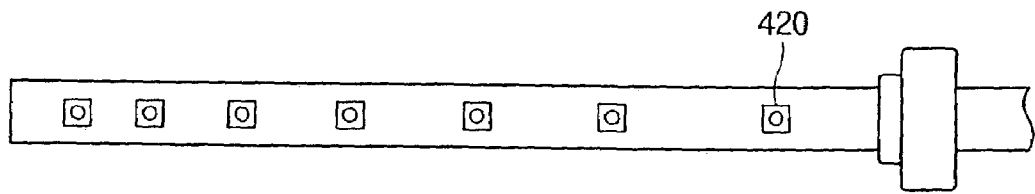

Referring to FIG. 8c, which shows still another modified example of the gas supply nozzle 400, the spray openings 420 are formed at different intervals to ensure that the amount of the nitrogen gas supplied to the N-th wafer 10 is the same as the amount of nitrogen gas supplied to the first wafer 10. Specifically, the intervals between adjacent openings 420 increase as the distance from the side of the chamber 100 from which the gas supply nozzle 400 extends increases.

Figure 9A:
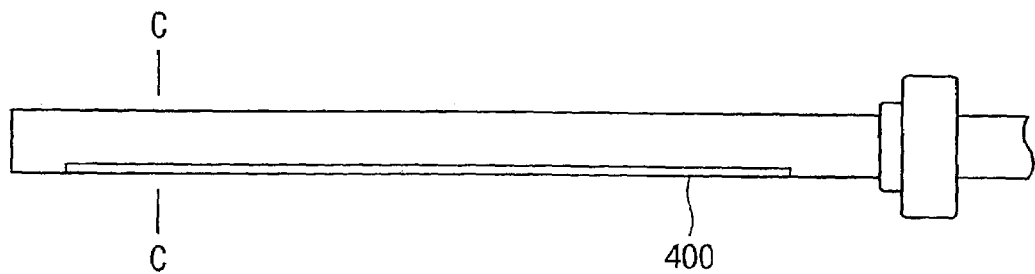
FIG. 9a is a side view showing another example of a gas supply nozzle of the cleaning apparatus shown in FIG. 2.
Figure 10A:
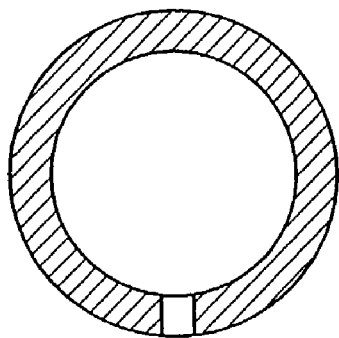

Referring to FIG. 9a and FIG. 10a, the gas supply nozzle 400 may have a slit-type of opening 440 instead of a plurality of discrete spray openings. In this embodiment, the length of the opening 440 spans the set of wafers 10, i.e., extends from the top of the first wafer 10 to the top of N-th wafer 10.

Figure 9B:
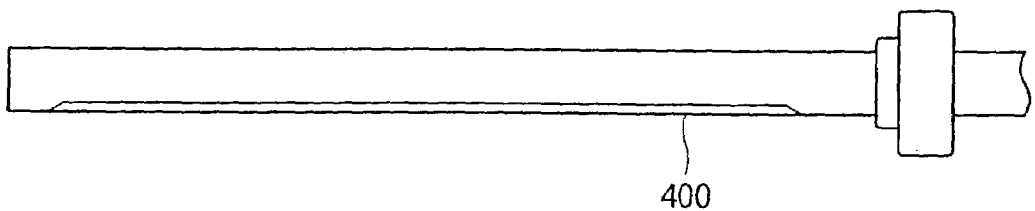
FIG. 9b and FIG. 9c are side views of modified examples of the gas supply nozzle.
Figure 10B:
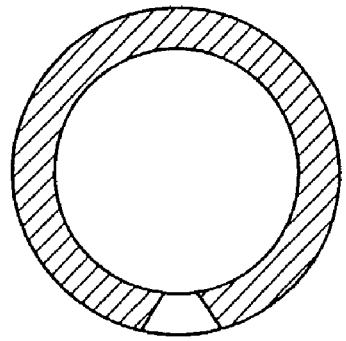
FIG. 10b is a cross-sectional view of a modified example of the gas supply nozzle.

Referring to FIG. 9b and FIG. 10b, the slit-type of opening 440 may flare outwardly at both the sides and the ends thereof so that the nitrogen is sprayed over all of the wafers 10.

Figure 9C:
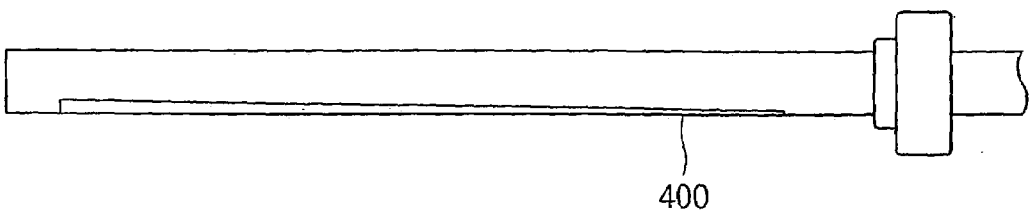

Referring to FIG. 9c, the width of the slit-type of opening 440 may increase gradually as the distance from the side of the chamber 100 from which the gas supply nozzle 400 extends increases.

The wafers 10 are cleaned as follows. First, the rinse (or chemical treatment) process is performed with de-ionized water (or a chemical solution) in the bath 140. For purposes of explanation, only the rinse process will be referred to. The de-ionized water with liquid IPA in the bath 140 is slowly discharged through the second discharge pipe 640. IPA vapor is sprayed into the chamber 100 through the spray pipe 240 while the de-ionized water is being slowly discharged. The wafers 10 may be moved upwardly during the discharging of the de-ionized water to speed up the overall cleaning process. The de-ionized water is quickly discharged through the first discharge pipe 620 once the wafers 10 have passed completely through the surface of the de-ionized water. Then the heated nitrogen gas is sprayed onto the wafers 10 in the bath 140 through the gas supply nozzles 400 in order to remove the de-ionized water and the liquid IPA adhering to the wafers 10.

According to the present invention, a condensed liquid of IPA formed at the exit of a spray pipe of a bubbler is retained within the spray pipe. Therefore, the IPA liquid layer in the bath 140 is not destroyed by the condensed liquid.

Furthermore, in the present invention, the holes of the gas supply nozzle 400 have different diameters or are spaced at different intervals. Therefore, the same amount of the nitrogen is supplied to all of the wafers 10 disposed in the bath 140.

Finally, although the present invention has been described in connection with the preferred embodiments thereof, various changes and modifications can be made thereto without departing from the true spirit and scope of the invention as defined by the appended claims.

What is claimed is:

1. An apparatus for cleaning semiconductor wafers, comprising:
a chamber having a bath, and a lid that covers said bath;
a source of liquid alcohol, and a source of a carrier gas;
a bubbler having a vapor generating part comprising a housing in which alcohol vapor used to dry wafers in said chamber is generated, and a spray pipe connected to the housing of said vapor generating part; and
a second supply pipe connecting said source of liquid alcohol to said housing and through which liquid alcohol is supplied into the housing such that a lower portion of the housing becomes filled with the liquid alcohol,
wherein the vapor generating part of said bubbler further comprises a third supply pipe in fluid communication with said source of carrier gas so as to receive carrier gas from said source of the carrier gas, and said third supply pipe having an end disposed in said lower portion of the housing such that said end of the third supply pipe will be submerged in the liquid alcohol that fills the lower portion of said housing, the end of said third supply pipe having an outlet in open fluid communication with said lower portion of the housing and through which outlet the carrier gas is supplied into liquid alcohol filling the lower portion of said housing so that the carrier gas will bubble through the liquid alcohol and thereby generate alcohol vapor from the liquid alcohol, and
said spray pipe extends into said chamber and has an exit end from which the alcohol vapor and the carrier gas issue in said chamber, and liquid retention means for preventing condensate of alcohol vapor, formed at the interior of said spray pipe within the chamber, from issuing from the exit end of the spray pipe.

2. An apparatus for cleaning semiconductor wafers, comprising:
a chamber having a bath, and a lid that covers said bath;
a source of liquid alcohol, and a source of a carrier gas;
a bubbler having a vapor generating part comprising a housing in which alcohol vapor used to dry wafers in said chamber is generated, and a spray pipe connected to the housing of said vapor generating part; and
a second supply pipe connecting said source of liquid alcohol to said housing and through which liquid alcohol is supplied into the housing such that a lower portion of the housing becomes filled with the liquid alcohol,
wherein the vapor generating part of said bubbler further comprises a third supply pipe in fluid communication with said source of carrier gas so as to receive carrier gas from said source of the carrier gas, and said third supply pipe having an end disposed in said lower portion of the housing such that said end of the third supply pipe will be submerged in the liquid alcohol that fills the lower portion of said housing, the end of said third supply pipe having an outlet in open fluid communication with said lower portion of the housing and through which outlet the carrier gas is supplied into liquid alcohol filling the lower portion of said housing so that the carrier gas will bubble through the liquid alcohol and thereby generate alcohol vapor from the liquid alcohol, and
said spray pipe extends into said chamber, said spray pipe having an exit end located in said chamber and from which the alcohol vapor and the carrier gas issue in said chamber, and an upper wall at the top thereof, said upper wall terminating at said exit end within the chamber, and said upper wall being inclined downwardly beginning within the chamber and in a direction away from said exit end, whereby the upper wall prevents condensate of the alcohol vapor formed at the interior of said spray pipe within the chamber from issuing from the exit end of the spray pipe.

3. An apparatus for cleaning semiconductor wafers, comprising:
a chamber having a bath, and a lid that covers said bath;
a source of liquid alcohol, and a source of a carrier gas;

a bubbler having a vapor generating part comprising a housing in which alcohol vapor used to dry wafers in said chamber is generated, and a spray pipe connected to the housing of said vapor generating part; and a second supply pipe connecting said source of liquid alcohol to said housing and through which liquid alcohol is supplied into the housing such that a lower portion of the housing becomes filled with the liquid alcohol, wherein the vapor generating part of said bubbler further comprises a third supply pipe in fluid communication with said source of carrier gas so as to receive carrier gas from said source of the carrier gas, and said third supply pipe having an end disposed in said lower portion of the housing such that said end of the third supply pipe will be submerged in the liquid alcohol that fills the lower portion of said housing, the end of said third supply pipe having an outlet in open fluid communication with said lower portion of the housing and through which outlet the carrier gas is supplied into liquid alcohol filling the lower portion of said housing so that the carrier gas will bubble through the liquid alcohol and thereby generate alcohol vapor from the liquid alcohol, and said spray pipe extends into said chamber, and said spray pipe has an upper wall at the top thereof, and a projection disposed at the exit end of the spray pipe, the projection extending downwardly and inwardly, with respect to the interior of the spray pipe, from said upper wall, whereby the projection prevents condensate of the alcohol vapor formed at the interior of said spray pipe within the chamber from issuing from the exit end of the spray pipe.

4. The apparatus of claim 1, and further comprising a first supply pipe connected to said source of liquid alcohol and extending into said chamber so as to supply the liquid alcohol into the chamber.

5. The apparatus of claim 1, wherein said source of liquid alcohol is a source of isopropyl alcohol and said source of carrier gas is a source of nitrogen gas.

6. The apparatus of claim 1, wherein said vapor generating part further comprises a fourth supply pipe connected to said source of carrier gas and having an end disposed in said housing at a location above said lower portion of the housing such that said end of the fourth supply pipe will be disposed above the liquid alcohol filling the lower portion of the housing, whereby said fourth supply pipe supplies carrier gas into the housing to carry the alcohol vapor through said spray pipe and into the chamber.

7. The apparatus of claim 1, wherein said spray pipe extends generally horizontally through the side wall of the chamber, the housing of said vapor generating part extends generally vertically alongside the chamber, and said bubbler further comprises a connector having a bend therein that extends between and connects said spray pipe and the housing of said vapor generating part to prevent alcohol vapor in the form of a mist from flowing from said housing to said spray pipe.

8. The apparatus of claim 1, wherein said bubbler further comprises a porous filter disposed in said vapor generating part to prevent alcohol vapor in the form of a mist from flowing from said housing to said spray pipe.

9. An apparatus for cleaning semiconductor wafers, comprising:

a chamber having a bath, and a lid that covers said bath; a source of liquid alcohol, and a source of a carrier gas; and a vapor generator connected to said sources of liquid alcohol and carrier gas, said vapor generator including a housing in which alcohol vapor used to dry wafers in said chamber is generated, and a spray pipe having first end portion disposed outside the chamber and connected to the housing such that alcohol vapor generated in the housing flows into the spray pipe, said spray pipe having a generally horizontal second end portion that is disposed within the chamber and terminates within the chamber at an exit end of the spray pipe in the axial direction of the spray pipe, the exit end of the spray pipe being open so that the alcohol vapor and the carrier gas issue from the exit end of the spray pipe while flowing generally horizontally in the axial direction of the spray pipe, wherein the spray pipe includes a liquid retention means for preventing condensate of the alcohol vapor, formed at the interior of said spray pipe within the chamber, from issuing from the exit end of the spray pipe.

10. The apparatus of claim 9, wherein said said spray pipe has an upper wall at the top thereof, the upper wall terminating at the exit end of the spray pipe within said chamber, and said upper wall being inclined downwardly beginning within the chamber in a direction away from said exit end of the spray pipe, whereby the upper wall prevents condensate of the alcohol vapor formed at the interior of said spray pipe within the chamber from issuing from the exit end of the spray pipe.

11. The apparatus of claim 9, wherein said spray pipe has an upper wall at the top thereof, and a projection disposed at the exit end of the spray pipe, the projection extending downwardly and inwardly, with respect to the interior of the spray pipe, from said upper wall, whereby the projection prevents condensate of the alcohol vapor formed at the interior of said spray pipe within the chamber from issuing from the exit end of the spray pipe.

12. The apparatus of claim 9, and further comprising a first supply pipe connected to said source of liquid alcohol and extending into said chamber so as to supply the liquid alcohol into the chamber.

13. The apparatus of claim 9, wherein said source of liquid alcohol is a source of isopropyl alcohol and said source of carrier gas is a source of nitrogen gas.

14. The apparatus of claim 9, and further comprising a second supply pipe connecting said source of liquid alcohol to said housing and through which liquid alcohol is supplied into the housing such that a lower portion of the housing becomes filled with the liquid alcohol, and wherein the vapor generator is a bubbler that further comprises a third and fourth supply pipes in fluid communication with said source of carrier gas so as to receive carrier gas from said source of the carrier gas, said third supply pipe having an end disposed in said lower portion of the housing such that said end of the third supply pipe will be submerged in the liquid alcohol that fills the lower portion of said housing, the end of said third supply pipe having an outlet in open fluid communication with said lower portion of the housing and through which outlet the carrier gas is supplied into liquid alcohol filling the lower portion of said housing so that the carrier gas will bubble through the liquid alcohol and thereby generate alcohol vapor from the liquid alcohol, and said fourth supply pipe having an end disposed in said housing at a location above the lower portion of said housing such that said end of the fourth supply pipe will be disposed above the liquid alcohol filling the lower portion the housing, whereby said fourth supply pipe supplies carrier gas into the housing to carry vapor of the liquid alcohol through said spray pipe and into the chamber.

15. The apparatus of claim 9, wherein said housing extends generally vertically alongside the chamber, and said vapor generator further comprises a connector having a bend therein that extends between and connects said spray pipe and the housing to prevent alcohol vapor in the form of a mist from flowing from said housing to said spray pipe.

16. The apparatus of claim 9, wherein said bubbler further comprises a porous filter disposed in said vapor generating part to prevent alcohol vapor in the form of a mist from flowing from said housing to said spray pipe.

17. The apparatus of claim 1, wherein said chamber has an upper portion constituted by a side wall, and a lower portion constituted by said bath, the lid is disposed on said upper portion, and said spray pipe extends through the side wall and into the upper portion of said chamber at a location beneath said lid.

* * * * *